United States Patent [19]

Levatter

[11] 4,370,175
[45] Jan. 25, 1983

[54] METHOD OF ANNEALING IMPLANTED SEMICONDUCTORS BY LASERS

[75] Inventor: Jeffrey I. Levatter, Encinitas, Calif.

[73] Assignee: Bernard B. Katz, LaJolla, Calif.

[21] Appl. No.: 100,025

[22] Filed: Dec. 3, 1979

[51] Int. Cl.³ .................. H01L 21/26; H01L 21/268
[52] U.S. Cl. ........................ 148/1.5; 148/187; 219/121 L; 357/30; 357/91; 427/53.1
[58] Field of Search ............... 331/94.5 PE, 94.5 H, 331/94.5 G; 148/1.5, 187; 219/121 L, 121 LA, 121 LB; 427/53.1; 357/91, 30

[56] References Cited

U.S. PATENT DOCUMENTS

| | | | |
|---|---|---|---|
| 4,147,563 | 4/1979 | Narayan et al. | 148/177 |
| 4,154,625 | 5/1979 | Golovchenko et al. | 148/1.5 |
| 4,181,538 | 1/1980 | Narayan et al. | 148/1.5 |
| 4,189,686 | 2/1980 | Bray et al. | 331/94.5 G |
| 4,198,246 | 4/1980 | Wu | 148/1.5 |
| 4,203,781 | 5/1980 | Miller | 148/1.5 |
| 4,229,232 | 10/1980 | Kirkpatrick | 148/1.5 |
| 4,238,694 | 12/1980 | Kimerling et al. | 357/91 |
| 4,243,433 | 1/1981 | Gibbons | 148/1.5 |

OTHER PUBLICATIONS

Christensen in High Power Lasers & Applications, Ed. Kompa et al., Springer Verlag, Berlin, 1978, 45-48.
Olson et al., Rev. Sci. Instrum. 47 (6) (1976), 677-683.
Tsu et al., Phys. Rev. Letts. 42 (1979), 1356-1358.
Tseng et al., Appl. Phys. Letts. 32 (1978), 824.
Bradley in High Power Lasers and Applications, Ed. Kompa et al., Springer Verlag, Berlin, 1978, pp. 9-18.
Baeri et al., Appl. Phys. Letts. 33 (2) 1978, pp. 137-140.
Alaev et al., Sov. J. Quant. Electronics, 6 (1976), 610-611 (English).
Fahleh, IEEE-J. Quant. Electron. QE-16, (Nov. 1980), 1260-1262.
Hess in 1979 IEEE/OSA Conf. on Laser Engineering and Applications, Washington, D.C., May 1979, p. 45.

*Primary Examiner*—Upendra Roy
*Attorney, Agent, or Firm*—Fulwider, Patton, Rieber, Lee & Utecht

[57] ABSTRACT

A high power excimer laser emits a pulsed output at a high repetition rate in the ultraviolet wavelength region and a uniform power output across the laser beam. By subjecting doped silicon wafers to the pulsed laser output, epitaxial regrowth of silicon crystals can be induced to repair damage to the silicon crystal structure which normally occurs during implantation of the dopant materials.

12 Claims, 7 Drawing Figures

METHOD OF ANNEALING IMPLANTED SEMICONDUCTORS BY LASERS

BACKGROUND OF THE INVENTION

1. Field of the the Invention

The present invention relates to the manufacture of solar photo-voltaic cells and an excimer laser generating device for producing a pulsed output at a high repetition rate and with uniform power output across the beam aperture, for use in annealing solar photo-voltaic cells.

2. Description of the Prior Art

In the manufacture of solar photo-voltaic cells, a semiconductor junction must be produced which will respond to incident solar radiation by producing a flow of electrons, and a counterflow of "holes". The element silicon, when suitably doped to form a P-N junction, responds in this fashion. Typical dopant materials include boron, phosphorous and arsenic. The electrical conversion efficiency of conventional solar voltaic cells is from about 10 to 16 percent. That is, 10 to 16 percent of incident radiant solar energy is converted to electrical energy using doped silicon wafers as solar voltaic cells. Other photosensitive semiconductor substrate materials may be substituted for silicon, for example gallium arsenide, germanium, gallium phosphide, indium phosphide cadmium telluride, aluminum antimonide, cadmium sulphide, copper oxide, and others.

The principal problem that arises in the manufacture of solar voltaic cells according to the present state of the art is that in order to implant the dopant material, the underlying silicon crystalline structure is damaged during the ion implantation process. That is, the implantation process removes atoms from an orderly crystalline lattice-work at the implantation site, and creates partial and disoriented latticework regions. This damage is repaired, according to the current state of the art, by extended heating of the doped silicon wafers following implantation of the dopant material for several hours at temperatures typically above 200° C. Furthermore, with the present state of the technology, only monocrystalline silicon is useful in the manufacture of solar voltaic cells, since a single crystalline lattice work is necessary in order to achieve a directed current flow, and hence a current which can be applied to external circuitry. The production of monocrystalline silicon is far more costly than polycrystalline or amorphous silicon, and much less readily available. As a consequence, the high cost of manufacture has thus far precluded the use of solar voltaic cells as a source of electrical power for any but the most exotic applications. To date, the use of solar voltaic cells as a source of electrical energy has been commercially significant only in supplying power to vehicles and instruments used beyond the earth's atmosphere, and instruments which must necessarily be used in remote, unattended locations.

There are two general type of conventional dopant implantation techniques used in the manufacture of solar voltaic cells. In the ion implantation technique the dopant is a high energy ion beam of a number of kilovolts. The impurity ions of arsenic, phosphorous or boron are rammed into the lattice structure of the silicon wafer with this high energy beam. This damages the crystal lattice structure of the monocrystalline silicon wafer, which necessitates subsequent annealing. In the other commercially significant technique of dopant implantation, the dopant material is applied to the surface of a monocrystalline silicon wafer and thereafter thermally diffuses into the wafer. The thermal diffusion process complicates the manufacture of the cells, and adds to the manufacturing expense the same as high temperature thermal annealing.

Various attempts have been made to utilize laser beams for the purpose of annealing doped silicon wafers following implantation of the dopant material. This annealing has been attempted both to reform monocrystalline silicon structure, and also to transform amorphous or polycrystalline silicon into a monocrystalline structure following dopant ion implantation. For example, U.S. Pat. No. 4,151,008 describes a pulsed laser annealing process which utilizes a neodynium-yag laser beam to effectuate annealing. Such a laser produces a beam which does not directly produce the ultraviolet wavelength so readily absorbed by silicon. Also, the pulse repetition rate achieved with such a laser is relatively low (0–20 pulses per second) limiting the average laser output power, and hence limiting the procesing capability of this type of system. Because of the low repetition rate and infrared wavelength of the yag laser, the annealing process using such a device requires an excessively large input power applied over a prolonged period of time. To achieve an ultraviolet output, an ultraviolet flash lamp was employed in place of the laser. However, the light output produced by the ultraviolet flash lamp is quite difficult to focus in order to achieve the required energy density to effectuate semiconductor annealing. In such an ultraviolet flash lamp system, the energy per pulse achieved in the beam and beam uniformity are both poor. While interesting as a laboratory tool, such a system is not feasible for use in the mass commercial manufacture of solar voltaic cells.

U.S. Pat. No. 4,154,625 also deals with the use of a laser in annealing semiconductor devices, and the fabrication of polycrystalline solar cells in particular. This patent suggests lasers in the optical range, but a ruby laser was utilized. The wavelength of a ruby laser is primarily in the red visible and infrared regions, not the ultraviolet where silicon absorbs energy well. Lasers such as this which project beams in the infrared and visible range are capable of high peak power, but their beam uniformity has historically been poor. The energy level obtained with the ruby laser is quite large, but with the poor beam uniformity achieved large localized temperature variations in the silicon exist. The silicon therefore is melted and reforms to a polycrystalline or monocrystalline structure at some implantation sites while the energy applied is inadequate to induce epitaxial regrowth at adjacent sites. U.S. Pat. No. 4,147,563 utilizes a similar ruby laser to implant impurities in silicon in the manufacture of solar cells, rather than to anneal the silicon following implantation.

U.S. Pat. No. 4,059,461 suggests the use of a continuous wave Nd:YAG laser for purposes of annealing silicon in the fabrication of solar voltaic cells. The laser suggested operates at only 6 or 7 watts of power, however, although lasers of larger power output, such as CO or $CO_2$ having a power output of 100 watts are contemplated. However, such lasers operate primarily in the infrared region. Because of the lower absorption of silicon in this region, a higher average power is necessary to achieve annealing. This excessive power produces excessive heating of the entire silicon wafer, which can distort or damage the entire wafer. Laser scanning is applied to polycrystalline semiconductor material in annealing. However, the laser systems employed according to this patent do not provide sufficient power and do not obtain an acceptable throughput rate. A complete heating and cooling cycle of doped silicon took approximately 10 minutes. In continuous wave scanning the beam must be focused to a very tiny point. This necessitates intricate mechanical apparatus to control a scan pattern. Also, in continuous wave annealing epitaxial regrowth is induced in the solid phase, not the liquid phase as in pulsed annealing processes. Consequently, the quality of repair to the damaged lattice sites is not as good in continuous wave annealing as contrasted with pulsed annealing. Accordingly, such a device could not feasibly be scaled for the commercial manufacture of solar voltaic cells.

SUMMARY OF THE INVENTION

According to the present invention, a pulsed excimer gas laser system has been devised which overcomes the deficiencies present in prior lasers used for the annealing of silicon or other useful semiconductor materials in the manufacture of solar voltaic cells. The laser of the present invention has a high energy output per pulse, typically from 2 to 5 joules per pulse. Moreover, the laser of the present invention operates at a high pulse repetition rate. Repetitions in the range of at least a kilohertz are readily achieved. This repetition rate, coupled with the high energy output per pulse achieves a high average power output during operation of the device. The laser of the invention produces several hundred watts of average power, typically from 200 to 500 watts, during operation.

Furthermore, the pulsed excimer laser of the present invention achieves a high degree of uniformity of power output across the beam aperture, and at a wavelength in the ultraviolet range. The amplitude of power output across the beam aperture is extremely uniform, and varies by no more than from 2 percent to 5 percent.

All of the foregoing features of the excimer laser of the invention render the device particularly suitable for laser annealing of dopant silicon in the commercial manufacture of solar voltaic cells. The ultraviolet wavelength produced by the laser of the invention is readily absorbed by silicon and other semiconductor materials used in solar voltaic cells, and the beam uniformity achieved prevents any major discontinuities in crystal regrowth from occuring during the annealing process.

The laser of the invention is able to stimulate liquid phase epitaxial regrowth in monocrystalline silicon to quickly repair damage that occurs during the implantation process. It is well known that monocrystalline silicon, even with a damaged crystalline latticework, can be regrown free of crystalline defects when suitably annealed. The pulsed excimer laser of the present invention achieves this regrowth with greater uniformity and far more quickly than lasers heretofore employed for annealing monocrystalline or a large grain polycrystalline silicon in the manufacture of solar voltaic cells.

Moreover, the laser of the invention can be utilized to reform polycrystalline or amorphous silicon into a monocrystalline structure in the manufacture of solar voltaic cells. With the uniform application of energy to a polycrystalline silicon structure, the small crystals of that structure can be regrown and reformed into a large, monocrystalline structure. Furthermore, even amorphous silicon can be laser annealed with the laser of the present invention to produce a monocrystalline or a large grain polycrystalline silicon structure. For example, $SiCl_4$ can be vapor deposited onto saphire or graphite. The laser beam of the excimer laser of the present invention, when applied to this structure, reforms the silicon present into a single, monocrystalline structure grown from the saphire or graphite base.

A self-sustained volume discharged initiated by a homogeneous electron avalanche is a convenient method of gas laser excitation. The method involves the sudden application of a strong electric field considerably in excess of the breakdown threshold across the laser gas. This causes the initially low level of ionization within the discharge gap to grow exponentially via the electron avalanche process until the plasma impedance becomes limited by the output impedance of the driving electrical circuit. The driving circuit impedance, in turn, must be so chosen that electrical excitation of the laser gas mixture can progress at the desired rate during the main part of the current pulse. This method of excitation has been successfully employed in many transversely excited atmospheric-pressure (TEA) lasers such as $CO_2$, $N_2$, HF, and more recently, in the rare gas halide and metal halide excimers such as KrF, XeF, XeCl, ArF, HgCl, HgBr, HgI, etc. These lasers have proven to be a powerful source of infrared, visible, and ultraviolet coherent radiation due to the high density, and hence, high energy handling capacity of the high pressure gas.

The high pressure gas lasers based on the pulsed discharge method of excitation just described are usually referred to as "fast discharge lasers." This nomenclature is used since it has been found from experience that the high voltage electrical pulse creating the electron multiplication in the laser gas must have a very fast rise time and also a relatively short duration (of the order of $10^{-8}$ sec) in order to avoid the formation of filamentary arcs within the discharge volume. Efficient laser pumping in the presence of severe aching is, of course, impossible due to the inadequate excitation rates in regions of low current density and the too rapid thermal equilibrium rate (which tends to destroy population inversion) in regions of very high current density. In addition, the resultant non-uniform distributions of refractive index within the inhomogeneously excited medium also make formation of high optical quality laser beams difficult. Another problem associated with the onset of severe arcing in discharge pumped lasers is the very low plasma resistivity within the concentrated arcs. The sudden decrease in plasma resistivity with rapidly increasing local current densities may cause the total load resistance across the discharge gap to collapse momentarily to values far blow that of the driving circuit output impedance. When this occurs the discharge will either self terminate or go into an unstable oscillatory arc discharge mode, depending on the characteristics of the driving circuit and on the extent of the impedance mismatch. Such premature termination or interruption of the discharge, together with ineffective excitation due to non-uniform current distribution in the presence of severe arcing, tends to limit the total energy output of the laser. This arcing problem has been found to be especially troublesome in the generation of rare gas halide and metal halide lasers where efficient formation of the excimers generally requires a high uniform rate of electron impact excitation. The very presence of the electrophilic halogen molecules and excited metastable rare gas atoms tends to make the electron multiplication and disappearance rates very sensitive functions of the local electric field strength and current density. Accordingly, with the exception of some very recent work the effective discharge volume, pulse duration, and maximum laser energy output have all been very low (typically of the order of 0.1 liter, 10 nanoseconds, and 0.1 joules per pulse, respectively).

The foregoing difficulties of high pressure discharge undoubtedly related to the absence of strong electronic and ionic diffusion effects responsible for homogenization and stabilization of low-pressure "glow discharges." To bypass these difficulties, high energy electron beams have been successfully utilized both as a direct pumping source and as a stabilizing ionization source for homogeneous excitation of high pressure gas lasers over extended volumes. In many practical applications (for example, applications requiring high pulse repetition rates), however, the avalanche/self-sustained discharge method has the advantage of relative simplicity when compared with either the electron-beam-pumped or the electron-beam-sustained discharge method. The simplicity of the avalanche/self-sustained discharge method is mainly a result of the lower voltage requirement and the absence of fragile foil windows needed for transmission of the high energy electron beams at high current densities.

The physical structure of the laser beam generating device of the present invention is quite different from lasers of prior design. This is due, in large part, to the unique principal by means of which homogeneity in the gas plasma in the laser generating chamber is achieved. In many conventional avalanche discharge lasers, a spark gap switch is employed to cyclically bring the cathode and anode in a laser beam generating chamber to a sufficient differential voltage to apply power to a gas contained therein. Power is applied by means of an electric discharge into the gas between the anode and cathode to raise the energy level of electrons in electron shells in the gas to a higher state. If this energy is sufficient to achieve a laser threshold, some of the electrical energy will be converted to electromagnetic energy as laser radiation.

As delineated by Levatter and Lin, "Criteria for Maintaining a Uniform Formative Phase During a High Pressure Avalanche Discharge", Gaseous Electronics Conference, Buffalo, N.Y., 1979, there are several criteria that must be met in order to achieve a uniform large volume avalanche discharge without the formation of streamers. These criteria are: (1) the electric field between the discharge electrodes must be uniform; (2) the discharge volume must be preconditioned by creating a spatially uniform level of electron density (preionization) of between $10^4$ to $10^8$ centimeters $^{-3}$, the exact value depending upon the nature of the gas mixture and gas pressure; and, (3) the rate of change of the voltage (dV/dt) applied to the discharge electrodes must be at least $10^{12}$ volts per second.

To date there have been only two transverse electric (TE) discharge lasers that have fully met the above criteria. The first is the ultraviolet preionized H$_2$O Blumlein laser described in an article by Levatter and Bradford, "Water Blumlein Driven Fast Electric Discharge KrF Laser," Applied Physics Ltrs., Vol. 33, pages 742–744, 1978, and the second is the x-ray preionized double transmission line laser of Lin and Levatter "X-ray Preionization for Electric Discharge Lasers" Applied Physics Letters Vol. 34, pages 505–508, 1979.

The water dielectric Blumlein transmission line switch laser is operated by a self-triggered rail spark gap similar to that described by J. C. Martin in "Multichannel Gaps" Switching Note Number 10, SSWA/JCM/703/27, Atomic Weapons Research Establishment, Aldermaston, England. The rail gap in this laser is pulse charged to a voltage above its natural d.c. voltage breakdown $V_{DC}$. When the gap is sufficiently overvoltaged, the gap breaks down in numerous parallel arc channels. The pulsed voltage can exceed $V_{DC}$ for a short duration because initially there are not electrons within the gap to start the avalanche, and because it takes a finite time for the initial spark channel to grow into an arc. Although this type of switch does produce the required dV/dt, the statistical nature of the breakdown process in an unpreionized gap is such that the amplitude and time jitter of the breakdown are very large. This makes this particular water dielectric Blumlein driven laser system unsuitable for the manufacture of solar voltaic cells. The x-ray preionized electric discharge laser by Lin and Levatter uses a similar switch, and has the same limitation.

In order to achieve a homogeneous volume avalanche discharge suitable for laser excitation, it is necessary to uniformly preionize the discharge volume. In the water dielectric Blumlein driven discharge laser, ultraviolet radiation from multiple sparks generated inside the laser cavity was used to produce the required preionization. In the x-ray preionized electric discharge laser, x-rays generated by an external electron beam were used for the same purpose. In both of these systems the preionization source was powered by a separate pulse forming network and energy storage bank making the entire system less efficient and requiring critical time delay circuitry to control the timing between preionization and the main discharge.

The gas laser system of the present invention is a high repetition rate, uniform volume, transverse electric discharge laser with pulse triggered, multi-arc channel switching. This laser system creates a large volume homogeneous avalanche electric discharge in almost any gas mixture with a very high ratio of electric field to gas density. The laser system of the invention incorporates a folded liquid Blumlein pulse forming network as the electrical drive circuit along with a unique fast parallel arc channel ultraviolet discharge preionization source that does not require any additional drive circuitry or energy supply.

The laser pulse forming network is switched by a bar gap of unique construction that is capable of very large rates of change of voltage and current. The rate of current change is greater than $10^{13}$ amps per second and the voltage rate of change is greater than $10^{13}$ volts per second. The pulse triggered device allows the switch to operate with several hundred arc channels per meter of gap width, yet is not susceptible to trigger erosion or to transient electrical coupling which can limit the useful lifetime of ordinary triggered spark gaps. The laser cavity and multi-arc channel spark gap of the invention are also fully compatible with fast, high volume rate gas flow allowing the entire system to operate at high repetition rates and hence high average power for long periods of time without maintenance.

The laser system of the present invention overcomes the problem of time and amplitude jitter characteristic of the water dielectric Blumlien driven and x-ray preionization lasers by injecting a burst of ultraviolet radiation and electrons directly into the discharge switch at selected points. This causes the switch to breakdown in a large number of separate arc channels simultaneously. Unlike a conventional trigatron switch in which the applied voltage never exceeds the natural d.c. breakdown potential of the gap, the voltage pulse in the spark gap of the present invention is applied in a short pulse of less than one microsecond to a potential greater than the d.c. breakdown voltage level $V_{DC}$. If the gap is not triggered, it will break down at some point above the d.c. voltage breakdown level. This higher, self-triggering level will vary, however. To trigger the switch of the present invention, electrons are injected directly into the rail gap by means of a spark created between the trigger pin electrodes and one of the rail gap electrodes after the voltage has exceeded the d.c. breakdown voltage. As the voltage at which trigger operation is fixed is moved closer to the self-breakdown voltage, the faster the gap will break down, but the higher will be the probability of the gap self-triggering thus creating time jitter in the overall breakdown process. The optimum trigger point is therefore somewhat just above the d.c. voltage breakdown level $V_{DC}$ so that a consistent voltage breakdown level is achieved.

Preionization in the laser system of the present invention is automatic, and no active time delay circuitry between preionization and the main discharge is required. Accordingly, no time delay circuitry between the application of power to the preionizing electrodes and the application of power to the laser cathode is necessary. Preionization is obtained from multiple, parallel ultraviolet sparks behind a gas permeable cathode.

The Levatter and Bradford water dielectric Blumlien driven discharge laser employed an array of 120 preionization pin electrodes that arced to a blade mounted between a screen cathode and its support ring. However, a delay circuit was necessary to synchronize the application of preionization voltage to the preionizing pins and the application of the discharge voltage pulse to the cathode. In another system, preionization was obtained from multiple series spark gaps known as spark boards, positioned behind a cathode. Such a device is described in H. J. Sequin et al. IEEE Journal of Quantum Electronics QE-11, pages 774 et seq., 1975. This device produced sparks that occurred sequentially, thus causing a time delay and uniformity problems in the main laser discharge. This device also required a separate pulse forming network for the preionization charge and for the main discharge.

According to the present invention, multiple parallel sparks are produced that operate in series with the main laser pulse forming network. When the bar gap of the laser has switched, a fast rising (less than 10 nanosecond) high voltage pulse arrives at the preionization electrodes, thus causing the preionizing pin electrodes to break down to the laser cathode in the form of multiple parallel sparks. Because the voltage rise time is very fast, all of these sparks happen simultaneously and with a delay determined solely by the value of the capacitance connected between the anode and cathode which serves to hold the cathode to ground potential for the first few nanoseconds of operation. After this fixed and automatic delay, a high voltage fast rising voltage differential develops across the anode and cathode of the laser gap resulting in a uniform volume discharge in the laser generating chamber. Because the parallel ultraviolet preionizing sparks are in series with the laser pulse forming network, no additional energy is required to drive them, and incorrect timing of the preionizing discharges and main discharge cannot occur.

Because of the unique trigger electrode configuration and interconnection of the electrodes of the present invention, a pulsed laser output is achieved which has a beam uniformity and pulse repetition rate heretofore unobtainable with prior laser systems. Moreover, the power output achieved in the excimer laser of the invention is much higher in the ultraviolet region than has previously been obtained. These features make the laser of the present invention uniquely suited for laser annealing of solar voltaic cells, and for the mass, commercial manufacture of such cells.

The invention may be described with greater clarity and particularly by reference to the accompanying drawings.

DESCRIPTION OF THE PREFERRED EMBODIMENT

Figure 1:
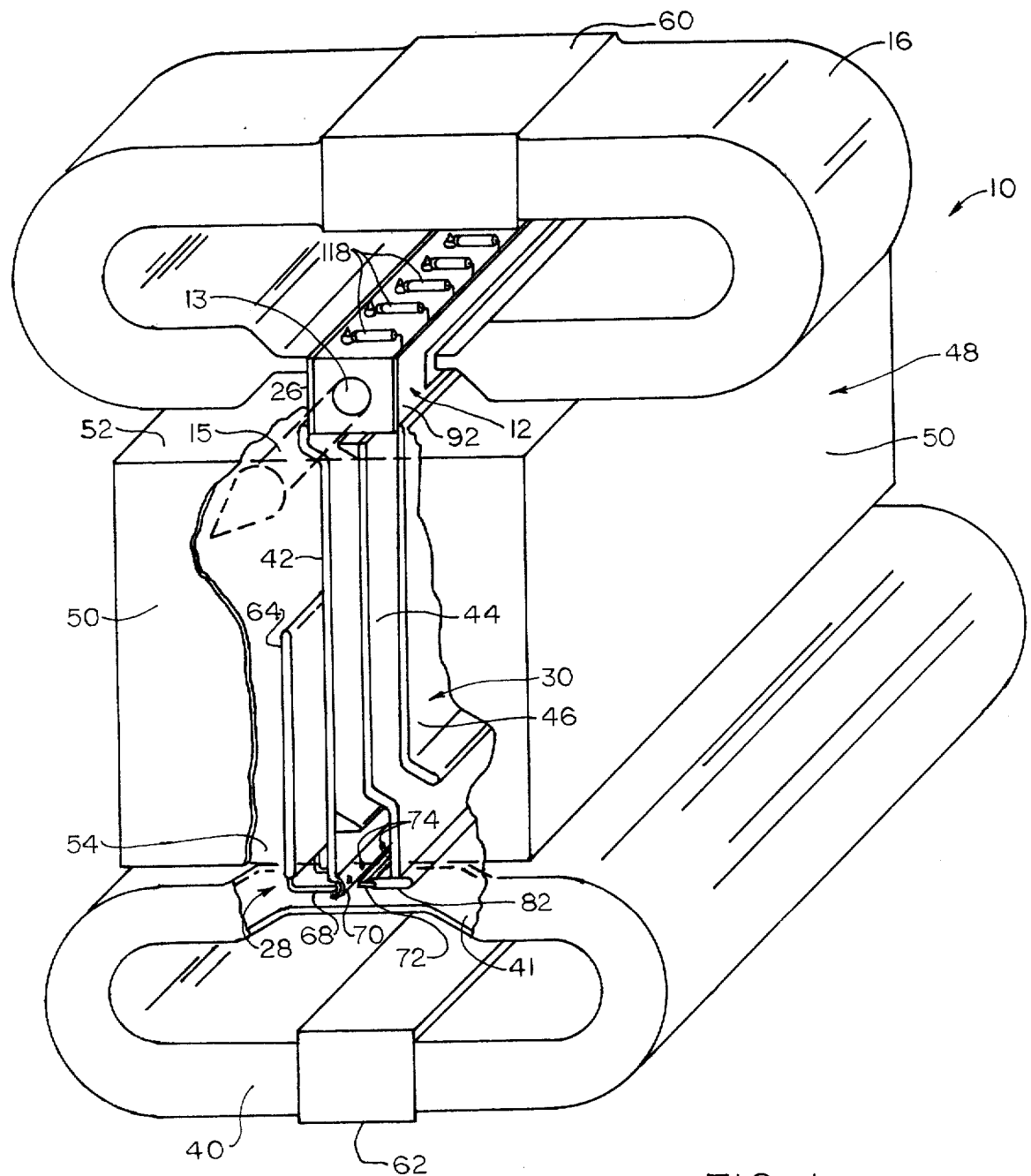
FIG. 1 is a perspective view of the laser of the invention.
Figure 2:
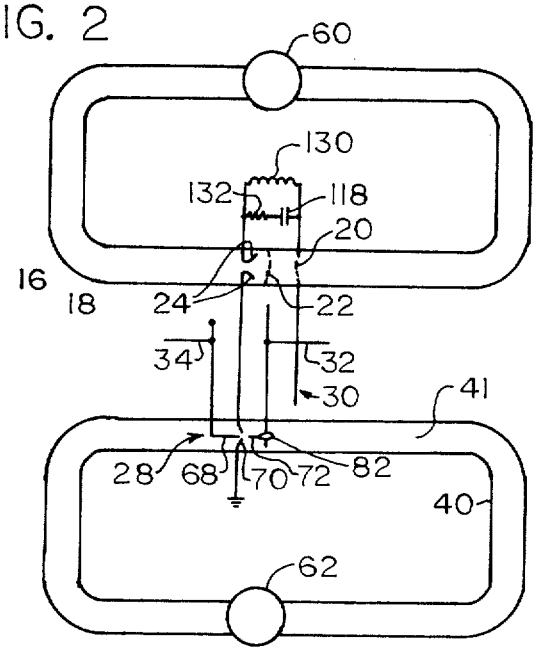
FIG. 2 is a schematic diagram of the construction of the laser of the invention.
Figure 3:
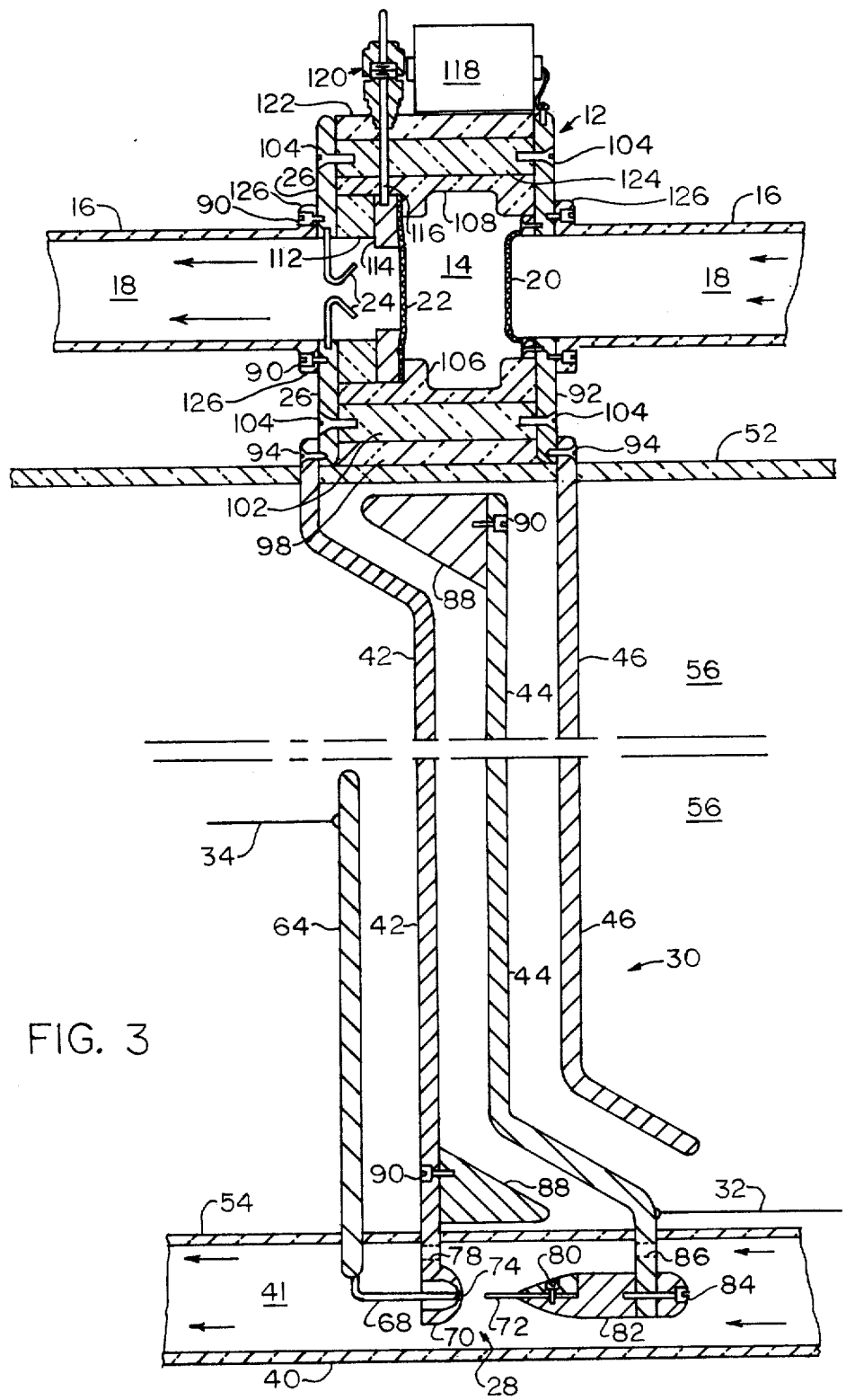
FIG. 3 is a sectional view of a portion of the laser generating device illustrating the electrode configuration and arrangement.

An excimer gas laser 10 constructed according to the present invention is illustrated in perspective in FIG. 1. The laser generating device 10 includes a laser beam generating chamber housing 12 within which an elongated laser beam generating chamber 14 is defined, as depicted in FIGS. 2 and 3, and from which a pulsed laser beam is projected, as indicated at 15 in FIG. 1. A transverse gas conduit 16 is formed into a recirculating loop and defines a gas passageway 18, illustrated in FIGS. 2 and 3. Within the laser beam generating chamber 14 there is an elongated gas permeable anode 20 and a gas permeable cathode 22, both of which are elongated mesh screens, perforated strips, honeycomb structure, or some other gas permeable structure about one meter in length and about 2 centimeters in width across the gas flow passageway 18. Both the anode 20 and cathode 22 are constructed of some metal compatible with the gas mixture utilized in the gas flow chamber 18. For example, the anode 20 and cathode 22 may both be formed of aluminum, nickel or stainless steel.

A series of spaced pairs of preionizing electrode pins 24 are located in the laser beam generating chamber 14 and are coupled to a common metal plate 26, forming a wall of the housing 12. The electrode pins 24 are bent back upon themselves to point upstream and away from the center of the passageway 18. The preionizing pins 24 are constructed of stainless steel tantalum, or possibly nickel or rhenium. The preionizing pins 24 and the anode 20 and the cathode 22 are interconnected to first apply an ionizing potential between the preionizing electrodes 24 and the cathode 22, and to thereafter produce a spacially uniform laser discharge between the cathode 22 and the anode 20.

A pulse triggered multichannel bar gap switch is indicated generally at 28 in FIGS. 2 and 3. The bar gap switch 28 is connected to the preionizing electrodes 24 and to the anode 20 by a Blumlein pulse forming network, indicated generally at 30. The Blumlein pulse forming network 30 is powered by a conventional pulse power source on line 32. The power source on line 32 pulses the Blumlein pulse forming network 30 with a pulse charge of from 50 to 60 kilovolts in five microseconds and is and at a frequency of at least 100 hertz. The pulse source is connected to the bar gap switch 28 by line 34 by a coupling arrangement of predetermined delay which is responsive to the pulses on line 32. The bar gap switch 28 creates multichannel sparks only after the voltage applied on line 34 has exceeded the ionizing breakdown voltage of a gaseous medium flowing in a second gas flow passageway 41. The Blumlein pulse forming network 30 includes a plurality of parallel electrode plates 42,44 and 46, which are housed within a liquid dielectric chamber 48. The liquid dielectric chamber 48 is constructed generally in the form of a rectangular prism with walls 50, a roof 52, and a floor 54 constructed of some dielectric material, such as phenolic resin, plexiglass, alumina or some other dielectric. The dielectric chamber 48 contains a liquid dielectric, which may be distilled water or alcohol indicated generally at 56 in FIG. 3. It is to be understood that the liquid dielectric chamber 48 is quite long, as contrasted with the vertical electrode dimensions, as illustrated in FIG. 3, and for this reason the vertical center section of the dielectric chamber 48 has been omitted from FIG. 3 to allow clear illustration of the electrodes of the laser or laser generating device 10.

A gas flow conduit 40 is formed into a recirculating loop as illustrated in FIG. 1, to define the gas flow passageway 41. The bar gap switch 28 is located in the passageway 41 just below the floor 54 of the dielectric chamber 48, as illustrated in FIG. 3.

The gas flow conduit 16 is connected to the laser beam generating chamber housing 12, as illustrated in FIG. 1, and is constructed in a closed loop and includes a fan or gas pump 60 for forcing a mixture of helium, a rare gas and a halogen or gas halide through the first gas passageway 18 and through the laser beam generating chamber 14. The rate of gas flow in the passageway 18 is sufficient to clear gas from the vicinity of the anode 20, cathode 22 and preionizing electrodes 24 with each successive pulse on the Blumlein pulse forming network 30. If the distance between the anode 20 and cathode 22 is two centimeters, and the distance between the cathode 22 and the preionizing electrodes 24 is one centimeter, and if the pulse repetition rate on line 32 is one hundred hertz, the gas volume between the anode 20 and preionizing electrodes 24 must be cleared every one hundredth of a second.

The gas conduit 40 is likewise arranged in a recirculating loop with gas driven by a pump 62, as illustrated in FIG. 1. The electrode plates 42, 44 and 46 of the Blumlein pulse forming network 30, and the trigger line electrode plate 64 extend through the floor 54 of the liquid dielectric chamber 48 into the gas flow conduit 40 as depicted in FIGS. 1 and 3.

The gas composition flowing through the conduit 40 is typically nitrogen, air, or a mixture of sulfur hexafluoride in nitrogen. The gas composition in the conduit 16, on the other hand, is a mixture of helium with a rare gas and a halogen or gas halide. Xenon, argon or krypton may be utilized as the rare gas, while fluorine, chlorine, iodine, bromine or hydrogen chloride may be used as the halogen component. A suitable mixture might be helium-94.8%, xenon-5% and hydrogen chloride-0.2%. The pressure in the conduit 41 is maintained at from 1 to 5 atmospheres psia.

All of the electrode plates 42, 44, 46 and 64 in the liquid dielectric chamber housing 48 must be resistive to attack or degradation by the liquid dielectric 56 therein. If that dielectric is water, for example, the electrode plates may be stainless steel or nickel coated aluminum. Alternatively, the plates might be solid nickel.

The trigger line electrode plate 64 extends into the gas flow passageway 41 formed by the conduit 40 and terminates in a multiplicity of L-shaped trigger pins 68, which extend upstream at spaced intervals as indicated in FIGS. 1 and 3. Typically one hundred separate trigger electrode pins 68 are arranged in this manner. The trigger pins 68 are typically constructed of brass or tungsten, but may also be formed of stainless steel.

The electrode plates of the Blumlein 30 terminate in a pair of rail electrodes 70 and 72, located in the gas flow passageway 41 in the conduit 40. The rail electrode 70 is an electrically conductive elongated bar constructed for example of tungsten, molybdenum, brass or copper. The bar electrode 70 has a rounded front edge about one meter in length and is configured to define spaced apertures 74 on the rounded upstream facing surface thereof facing the other rail electrode which is a blade electrode 72. The spaced apertures 74 meet corresponding spaced enlarged concavities 76 defined in the reverse or back or downstream side of the bar electrode 70 opposite the blade electrode 72. The trigger pin electrodes 68 are embedded in these concavities 76 in spaced relationship therefrom and extend proximate to the apertures 74 as depicted in FIG. 3.

A plurality of apertures 78 are defined in that portion of the electrode plate 42 which extends into the gas flow passageway 41 to facilitate gas flow therethrough and to prevent turbulence in the gaseous medium in the passageway 41 in the conduit 40.

The other rail electrode, the blade electrode 72 is a planar or blade-like structure of good conductivity and having a high melting point. The blade electrode 72 may be constructed of tungsten, or molybdenum or tantalum. The blade electrode 72 may be a replaceable structure and is locked in disposition parallel to the direction of gas flow and aligned in a plane passing through the apertures 74 in the bar electrode 70 by a locking screw 80 which secures the blade like electrode 72 in an electrically conductive torpedo shaped mounting 82. The torpedo shaped mounting 82, in turn, is secured to the extremity of the electrode plate 44 protruding into the gas flow passageway 41 by means of a series of locking screws 84. A plurality of apertures 86 are defined in the electrode plate 44 to facilitate gas flow through the passageway 41 and to prevent turbulence therein. This ensures that residual ions will be swept from the vicinity of the rail gap switch 28 after each pulse.

At the lower end of the electrode plate 42 and at the upper end of the electrode plate 44 in the Blumlein pulse forming network 30 in the dielectric chamber housing 48 there are triangular shaped structures 88 which serve as flux excluders. The flux excluders 88 are attached to the electrode plates as indicated by fastening screws 90. The purpose of the flux excluders 88 is to maintain the effective spacing between the electrode plates 42 and 44. During operation of the laser generating device 10, the impedance per unit length between the electrode plates 42 and 44 will remain constant unless the spacing therebetween changes. Because of the necessity for configuring the electrode plates to conform to the electrodes of the pulse triggered multi-arc channel switch 28, and also to the electrodes in the laser beam generating chamber 14, spacing of the electrode plates must be altered between the plates 42 and 44 as indicated in FIG. 3. To prevent the inductance in the gap between the electrodes 42 and 44 from increasing, the flux excluders 88 are provided. Without them, an inductance mismatch would exist and the electrical energy would be partially reflected by the impedance discontinuity in the plates 42 and 44. As a result, the efficiency in the transfer of energy from the Blumlein pulse forming network 30 to the preionizing electrodes 24 would suffer.

The laser beam generating housing 12 is formed with metallic, conductive walls 26 and 92. The electrode plate 42 of the Blumlein pulse forming network 30 is electrically coupled to the plate 26 by a contact interface immediately above the roof 52 of the dielectric chamber housing 48. The electrode plate 42 is fastened to the plate 26 by means of metal screws 94. Similarly, the electrode plate 46 of the Blumlein pulse forming network 30 passes through the roof 52 of the dielectric chamber housing 48 and is electrically coupled to the plate 92 by means of fastening screws 94 in a surface to surface interface of contact.

AS illustrating in FIG. 3, a positioning plate 98 is used to locate the laser beam generator chamber housing 12 atop the dielectric chamber housing 48. Above the positioning plate 98 there are a number of insulating spacing rods 102 to which the electrically conductive plates 26 and 92 are fastened by means of screws 104. The walls of the laser beam generating chamber 14 are defined by opposing longitudinally extending electrically insulating channel-shaped structures 106 and 108, which also serve as cathode retainers. The channel structures 106 and 108 are typically formed of teflon or kynar, and are positioned relative to the electrically conductive plates 26 and 92 and sealed by means of O-ring seals 110 as indicated. An annular electrically insulating spacing ring 112 is located interiorally of the metal plate 26 downstream from the channel structures 106 and 108 at the laser beam generating chamber 14 and surrounding the preionizing electrodes 24. A metal cathode retainer ring 114 is located immediately upstream thereof and is used to electrically couple the cathode 22 through an electrical connecting rod 116 to spaced capacitors 118 through threaded coupling nipples 120 which are threadably engaged with a longitudinal top plate 122 of the laser beam generating chamber housing 12. The total capacitance of the capacitors 118 is equal to approximately 5,000 picofarads. Upper insulating spacing rods 124 are used to space the upright electrically conductive plates 26 and 92 and is fastened thereto by means of screws 104. Flanges 126 of the gas passageway conduit 16 are fastened to the metal plates 26 and 92 by means of fastening screws 90 to maintain a gas tight seal about the passageway 18.

As illustrated in FIG. 2, the anode 20 and the preionizing electrodes 24 are coupled together by an inductor 130 which is typically from 0.1 to 1 microhenry in value. The inductor 130 poses a very small inductive impedance during charging of the Blumlein pulse forming network 30 by the pulse charge on line 32, which occurs over a period of approximately one microsecond. The pulse charge on line 32 thereby effectively charges both sides of the Blumlein 30 concurrently by means of the voltage potential which exists on the electrode plate 34 relative to the plates 42 and 46. However, when the rail gap switch 28 fires, it does so with a very fast rising pulse. Firing of the trigger line electrical plate by means of the line 34 results in a fast rising 10 nanosecond pulse. With a pulse of this nature, the impedance of the inductor 130 is very large so that a considerable voltage differential exists between the electrode plates 42 and 46 at this time.

Also as illustrated in FIG. 2, resistors 132 couple the preionizing electrodes 24 and the cathode 22. The resistors 132 thereby drain any residual static charge left on the cathode 22 from the last previous pulse. The value of each of the resistors 132 may be between 100 and 10,000 ohms. The value of the resistors 132 and the value of the capacitors 118 are related in that the RC time constant must be less than the repetition rate. That is, in the embodiment as contemplated, the RC time constant must be less than one milisecond, preferably between a milisecond and a microsecond.

The laser beam generating chamber housing 12 has a partially beam transparent window 13 at one end, and a mirror (not visible) at the opposite end. The gas flow passageway 18 transversely intersects the beam generating chamber 14, as illustrated in FIGS. 1 and 3.

In the sequence of events during repetitive pulsing of the Blumlein pulse forming network 30, the pulsed voltage is applied on line 32 to raise the potential on the electrode plate 44 relative to both of the electrode plates 42 and 46. Through the coupling arrangement previously described, the pulse on line 32 triggers a short, fast rising pulse on line 34. This pulse is less than 100 nanoseconds in duration. The inductor 130 exhibits a high impedance at this time and the trigger pin electrodes 68 produce a breakdown in the gas flow in the passageway 41 relative to the rail electrodes 70.

Figure 4:
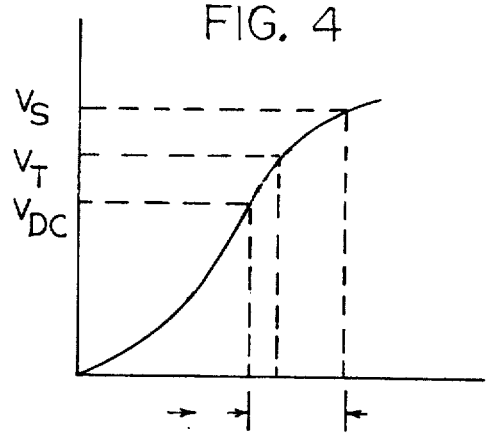
FIG. 4 is a graph illustrating the application of pulse charging voltage in the laser of the invention.

With reference to FIG. 4, the voltage at which line 34 is triggered is indicative as $V_T$. This voltage is greater than the natural d.c. breakdown potential of the gap between the rail gap electrodes 70 and 72, indicated at $V_{DC}$ in FIG. 4. However, the trigger voltage $V_T$ is less than the voltage $V_S$ at which breakdown will occur between the electrodes 70 and 72 without a triggering pulse. Because the exact voltage $V_S$ does not occur with consistent uniformity, the lower voltage $V_T$, above the natural d.c. breakdown voltage $V_{DC}$ achieves the uniformity in discharge voltage required in the system. As the voltage at which the switch is fired, $V_T$, is moved closer to the self switching voltage $V_S$, the faster the gap will breakdown, but the higher probability of the gap self triggering. Therefore, the optimum trigger voltage $V_T$ is somewhere just above the natural breakdown voltage $V_{DC}$.

Since the trigger pins 68 are deeply embedded inside the bar electrode 70, they are not effected by the electric field that occurs in the rail spark gap switch 28. Hence there is little or no erosion of the trigger pin electrodes 68. In contrast, in prior trigger pin electrode systems the trigger pin electrodes usually suffer severe ion bombardment and hence severe erosion. The trigger pins 68 of the present invention are protected by their configuration and positioning in the concavities 76 in the back of bar electrode 70. While electrons and ultraviolet radiation are able to pass freely from the trigger pins 68 through the apertures 74 to the blade electrode 72, the trigger pins 68 are shielded from ions during discharge by the protective structure of the bar electrode 70.

Once breakdown occurs from the trigger pin electrodes 68 to the rail electrode 70, ultraviolet photons and electrons emanate through the apertures 74 to cause the rail gap electrodes 70 and 72 to arc at every aperture 74. This creates a fast rising high voltage pulse that switches the potential present on the electrode plate 44 to the electrode plate 42. As a result, the preionizing electrodes 24 produce a multiplicity of arcs from the pins 24 to the cathode 22. This occurs within a time of about 5 nanoseconds. During this time, the cathode 22 is held at the potential of the anode 20 because of the capacitance provided by the capacitors 118. As the preionizing energy is fed from the preionizing electrode 24 to the cathode 22, the capacitors 118 are charged in a period of about 5 nanoseconds. Once the capacitors 118 are charged, the voltage rises at the cathode 22. When it rises above the natural breakdown voltage $V_{DC}$, then an avalanche of electrons are created in the gas in the laser beam generating chamber 14. An energy output of the laser beam 15 in the range of from 2 to 5 joules is produced with each pulse. The pulsed laser outputs occur at a frequency of at least 100 hertz, and more typically one kilohertz. As a result, several hundred watts of average power (from 200 to 500 watts) are transmitted by the laser beam 15. Moreover, because of the uniform triggering at the voltage $V_T$, the amplitude variation of the beam output is extremely small. Because of the fast rising voltage pulse produced by the rail spark gap 28, and because of the uniform volume preionization induced by the multiple preionization arcs from the electrode pins 24 to the cathode 22, the uniformity of the beam across the beam window 13 varies by only between about 2% and 5%.

Figure 6:
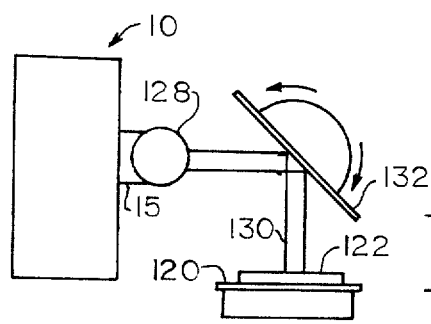
FIG. 6 is an elevational view diagramatically illustrating the manufacture of solar voltaic cells according to the invention.
Figure 5:
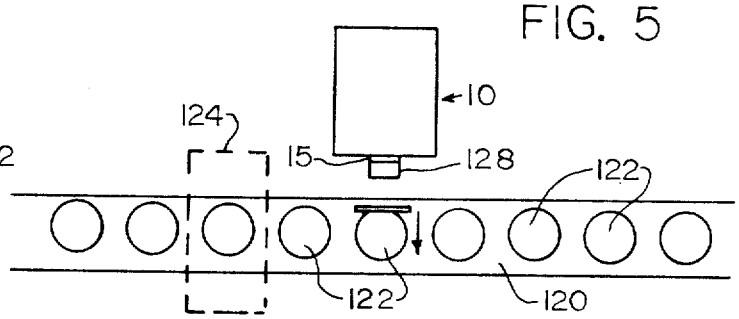
FIG. 5 is a plan view diagramatically illustrating the manufacture of solar voltaic cells according to the invention.
Figure 7:
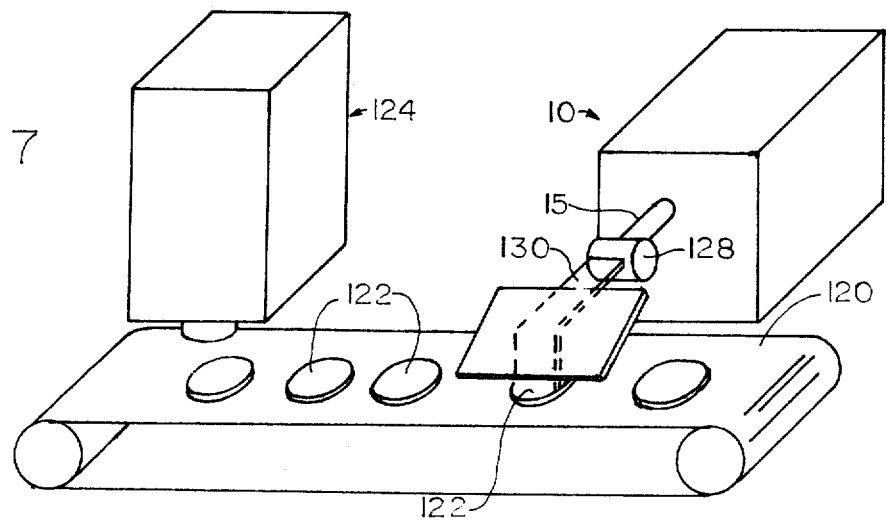
FIG. 7 is a perspective view diagramatically illustrating the manufacture of solar voltaic cells according to the invention.

The application of the laser beam generating device 10 to the manufacture of solar voltaic cells is illustrated in FIGS. 5, 6 and 7. In this system, conveyor belt 120 is operated in stepped movement at specific intervals to transport disk-shaped wafers 122 of silicon past an annealing station at which the laser generating device 10 scans the wafers 122 with the laser beam 15. The wafers 122 may be typically about 8 centimeters in diameter and of variable thickness. Prior to arriving at the annealing station at which they are treated by the laser beam 15 of the laser generating device 10, the wafers 122 are first implanted with a suitable dopant, typically boron, phosphorus or arsenic. The dopant may be deposited by one of several conventional techniques. Typical doping techniques are described and referred to in U.S. Pat. No. 4,147,563.

FIGS. 5 and 7 illustrate a conventional dopant implantation unit 124 which is used to deposit boron or some other dopant material on the wafers 122 as the conveyor belt 120 moves from left to right as indicated. Following implantation of the dopant material, the silicon wafers 122 move into alignment with the laser beam 15. The laser beam 15 is projected through a cylindrical lens 128 which reshapes the beam from the cross section of the window 13 in the laser generating device 48 to a swath 130 which is approximately four milimeters in thickness by about 8 centimeters in length aligned with the direction of movement of the conveyor belt 120, as illustrated in FIG. 5. The laser generating device 10 is typically located to the side of the conveyor belt 120 and transmits the beam 15 through the cylindrical lens 128 as the reshaped beam 130 laterally to a tilted mirror 132 which reflects the beam 130 downward onto the wafers 122 as they pass beneath on the conveyor belt 120. As illustrated in FIG. 6, the mirror 132 may be tilted alternatively to scan the rectangular swath 130 across the entire wafer 122 located therebeneath.

The beam 15 delivers energy at 1 to 2 joules per square centimeter at a laser repetition rate of 100 hertz. Two square centimeters of the wafer are therefore treated with each laser pulse so that it requires 50 pulses from the laser generating device 10 to anneal an entire wafer 122. This requires approximately ½ second at a laser repetition rate of 100 pulses per second. Consequently, at this repetition rate approximately 2 wafers can be annealed each second, A throughput of approximately 7,000 wafers per hour is therefore easily achieved. This throughput can be increased by a magnitude of 10 by merely operating the laser generating device 10 at a repetition rate of 1 kilohertz, a rate easily achieved with the device of the invention.

As previously noted, wafers 122 formed of monocrystalline silicon may be annealed in this fashion. Also, polycrystalline silicon wafers 122 can each be regrown into monocrystalline structure by annealing with the laser generating device 10. Furthermore, and also as previously noted, amorphous silicon can be deposited as silicon tetrachloride through vapor deposition on saphire or graphite. With the laser generating device 10 of the invention, monocrystalline silicon can be grown upon a disk-shaped saphire or graphite base through the annealing process described herein.

The critical features in treating the silicon wafers 122 to create a P-N junction for use as solar voltaic cells include annealing the silicon with a pulse laser beam having a wavelength predominantly in the ultraviolet region, a beam energy of at least 2 joules per pulse, a pulse repetition rate of at least about 100 pulses per second and a uniformity of beam pulse output that varies by no more than 5 percent across the area of beam output. Preferably, dopant implantation and annealing according to the invention using the laser beam generating device 10 are carried out at atmospheric pressure in air. Preferably also, the laser beam energy per pulse is from about 2 to about 5 joules and the average power achieved is several hundred watts, typically from about 200 to 500 watts. Laser uniformity of better than five percent may be achieved with the laser beam generating device 10 of the invention, and a uniformity of from 2 to 5 percent is typical.

Undoubtedly numerous other applications of the laser of the present invention will undoubtedly occur to those of ordinary skill in the art. Accordingly, the scope of the present invention is not intended to be limited to the specific laser generating structure depicted in the drawings, nor to the particular manner of solar voltaic cell manufacture depicted and described herein. For example, a ribbon of silicon may be treated as described, rather than the wafers 122 depicted. Accordingly, the scope of the present invention is not limited to the specific embodiment and utilizations described and illustrated herein but rather is defined in the claims appended hereto.

I claim:

1. A method of producing solar voltaic cells comprising implanting a dopant material into a photo sensitive semiconductor substrate to create a P-N junction, and annealing said substrate with a pulsed laser beam having a wavelength predominantly in the ultraviolet region, a suitable beam annealing energy of at least two joules per pulse, a pulse repetition rate of at least 100 pulses per second and a uniformity of beam pulse output that varies by no more than five percent across the area of beam output.

2. A method according to claim 1 further characterized in that said substrate is silicon in monocrystalline form prior to annealing with said laser beam.

3. A method according to claim 1 further characterized in that said substrate is silicon in polycrystalline form prior to annealing with said laser beam.

4. A method according to claim 1 further characterized in that said substrate is silicon in amorphous form prior to annealing with said laser beam.

5. A method according to claim 1 further characterized in that said implantation and annealing of said substrate are carried out at atmospheric pressure in air.

6. A method according to claim 1 further characterized in that at least about two square centimeters of said doped substrate are subjected to each pulse of said laser beam.

7. A method according to claim 1 further characterized in that said laser energy per pulse is from two to five joules.

8. A method according to claim 1 further characterized in that said laser beam uniformity is from two to five percent.

9. A method according to claim 1 further characterized in that said repetition rate of laser beam pulses is at least about one kilohertz.

10. A method according to claim 1 further characterized in that the average power of said beam pulse output is from two hundred to five hundred watts.

11. A method of producing semiconductor devices comprising implanting a dopant material into a semiconductor substrate to create a P-N junction, and annealing said substrate with a pulsed laser beam having a wavelength predominently in the ultraviolet region, a beam energy of at least two joules per second, a pulse repetition rate of at least 100 pulses per second and a uniformity of beam pulse output that varies by no more than five percent across the area of beam output.

12. A method according to claim 11 in which said semiconductor substrate is selected from the group consisting of silicon, gallium arsenide, germanium, gallium phosphide, indium phosphide, cadmium telluride, aluminum antimonide, cadmium sulphide and copper oxide.

* * * * *